United States Patent [19]

Miller et al.

[11] 4,147,969

[45] Apr. 3, 1979

[54] BATTERY PACK CHARGER AND TESTER

[75] Inventors: Curtis H. Miller, Burnsville; Mark R. Kaldun, St. Paul; Robert A. Arp, Eden Prairie, all of Minn.

[73] Assignee: Med General, Inc., Minneapolis, Minn.

[21] Appl. No.: 838,491

[22] Filed: Oct. 3, 1977

[51] Int. Cl.² .................... H02J 7/00; G01N 27/42
[52] U.S. Cl. ........................................ 320/2; 320/48; 340/636
[58] Field of Search ................................ 320/2-5, 320/48; 340/636

[56] References Cited

U.S. PATENT DOCUMENTS

| 3,209,230 | 9/1965 | Mas | 320/2 |
|---|---|---|---|
| 3,579,075 | 5/1971 | Floyd | 320/2 |
| 3,663,939 | 5/1972 | Olsson | 320/48 |
| 3,696,283 | 10/1971 | Ackley | 320/2 |
| 3,735,232 | 5/1973 | Fister | 320/2 |
| 3,746,961 | 7/1973 | Dobie | 320/48 |
| 3,890,555 | 6/1975 | Nelson et al. | 320/2 |
| 3,974,441 | 8/1976 | Van den Haak | 324/29.5 |
| 4,006,396 | 2/1977 | Bogut | 320/2 |

FOREIGN PATENT DOCUMENTS 1370089 10/1974 United Kingdom .................... 320/48

OTHER PUBLICATIONS

Electronic Design, vol. 19, Sep. 13, 1974, Moss, p. 176, "Voltage Monitor".

Primary Examiner—Robert J. Hickey
Attorney, Agent, or Firm—Orrin M. Haugen; Thomas J. Nikolai

[57] ABSTRACT

A charging stand for a rechargeable battery pack having a receptacle for receiving a battery pack to be charged and/or tested and having indicator means for providing a visual indication of the condition of the battery pack. The charging stand is adapted to be connected to the output of a standard AC to DC converter and includes a circuitry for applying a charging current to the battery pack as well as sensing and indicating that charging is in progress and that the battery potential is low or fully charged. A manually operated switch is also provided to permit the testing of the condition of a battery pack. When the pack to be tested is inserted into the receptacle in the test stand and the switch is operated, a battery, which is partially discharged, will result in a "low" indication being given, but if fully charged, a "high" indication will result.

5 Claims, 4 Drawing Figures

BATTERY PACK CHARGER AND TESTER

BACKGROUND OF THE INVENTION

FIELD OF THE INVENTION

Many devices are on the market which utilize rechargeable direct current battery packs as an energy source. Cameras, tape recorders, hand tools, shavers and a myriad of other appliances are typical examples. To accomplish recharging, an AC to DC converter is often employed to convert household alternative current line voltage to a DC voltage in the range of from 3 to 10 volts. Where the portable appliance is of the type having a removable power pack, it is convenient to have a charging station powered by the converter which accepts the battery pack and which further incorporates means for providing a visual indication of the condition of the battery pack being tested or charged. Also, because users of the foregoing types of appliances may not have a particular skill in the electronics field, it is desirable that the combination test stand and recharging station be substantially fool-proof in its operation. Furthermore, because of the economic choice between non-rechargeable and rechargeable power packs, it is essential that the apparatus utilized to provide the recharging and testing be low in cost so that the rechargeable power pack can remain economically competitive.

It is known in the prior art to provide charging devices for rechargeable batteries wherein a visual indication is given that charging current is flowing to the rechargeable battery. For example, the Dobie Pat. No. 3,746,961 discloses an AC to DC converter in which a neon lamp is provided which glows so long as charging current is flowing through the battery. However, when the battery becomes fully charged, the neon bulb ceases to carry a sufficient potential across it to continue glowing. The circuit of the Dobie patent, however, suffers from the defect that the lack of a visual indication is not necessarily indicative that the rechargeable battery has been fully charged. The neon glow tube will also be extinguished in the event of an open circuit between the battery to be charged and its contacts with the AC to DC converter.

Similarly, the Bogut U.S. Pat. No. 4,006,396 discloses a battery charging apparatus in which light emitting diodes are used to provide a visual indication that charging current is being supplied to the battery. However, in the Bogut patent there is no provision for indicating the charge status of a battery, i.e., whether it is in partially discharged condition or fully charged. Furthermore, the circuitry employed in the charging apparatus of the Bogut patent is relatively complex and therefore costly. As such, the arrangement may not be practical from the standpoint of marketability in that consumers might find it more economical to use throw away batteries rather than incurring the cost of the charging unit.

SUMMARY OF THE INVENTION

It is therefore a primary object of the present invention to provide a new and improved, low cost, reliable, fool-proof device for not only recharging battery packs but also providing a visual indication of the level of charge of a battery pack before the recharging cycle has been completed.

In practicing the invention, a conventional AC to DC converter is adapted to be disposed between an electrical outlet carrying AC current at line voltage and a test station. The power pack to be tested or recharged is adapted to be inserted into the test station. Contained within the station is circuitry for monitoring the state of charge of the battery pack and for providing a visual indication of:

(1) Charging current flowing;
(2) Battery potential below a predetermined value; and
(3) A fully charged condition.

The charging station preferably comprises a housing having a receptacle therein with electrical contacts which are adapted to mate with the corresponding contacts on the bettery pack to be recharged or tested. Also contained within the housing are electrical circuits which operate in two defined modes, namely the "charge" mode and the "test" mode. When an uncharged or partially charged battery pack to be recharged is inserted into the stand for the purpose of bringing it up to a fully charged condition, a first visual indicator is illuminated to indicate that charging is taking place. In the test mode, again a battery pack is inserted into the receptacle. A first indicator again comes on to indicate that the unit is energized and that testing can be accomplished. When a manually operated "test" button is depressed, the circuitry contained within the housing places an additional load on the battery pack. If the batteries in the pack are in a low state of charge, the first indicator remains operative. However, if the pack being tested is fully charged, a second indicator becomes illuminated, indicating satisfactory condition of the battery pack.

DETAILED DESCRIPTION OF PREFERRED EMBODIMENT

Figure 1:
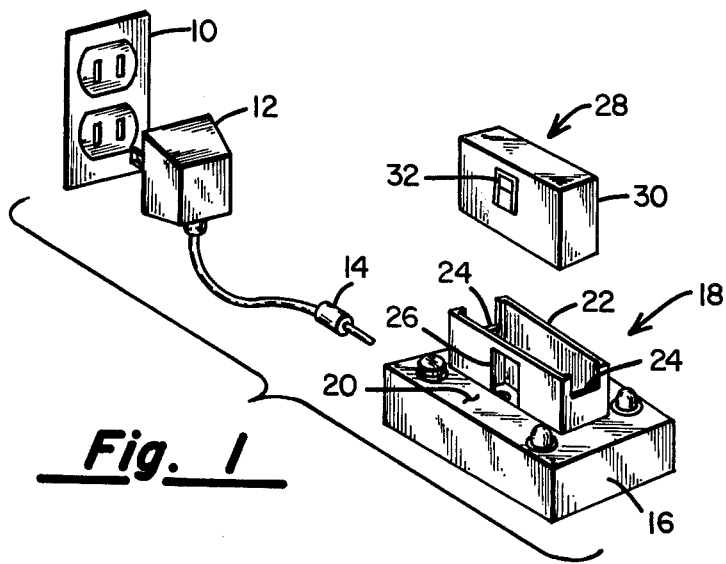
FIG. 1 is a pictorial drawing showing the relationship between the AC to DC converter, the charging stand of the present invention and the battery pack which is to be tested or charged.

Referring first to FIG. 1 there is shown a conventional wall outlet 10 which may typically be a 110 volt, 60 Hz. supply. Adapted to be plugged into the outlet 10 is a conventional AC to DC converter 12 which generally employs a full wave or half wave rectifier and other components for producing a predetermined DC voltage in the range of 3 to 10 volts, typically, across the contacts of a conventional male jack pin 14. A female receptacle (not shown in FIG. 1) is provided in the base 16 of the charging stand which is indicated generally by numeral 18. The stand 18 is preferably molded from a suitable plastic material and formed integrally on the top surface 20 thereof are the walls of a rectangular receptacle 22. The receptacle 22 has thumb notches 24 formed in opposite sides thereof and a slot 26 formed in a remaining one of the walls of the receptacle 22.

Positioned above the receptacle is illustrated a nickel cadmium battery pack 28 which is to be recharged or tested. The nickel cadmium cells themselves are contained within a plastic housing 30 and on one side of the housing 30 is an integrally formed leaf spring 32 which cooperates with the slot 26 in the side wall of the receptacle 22 to form a detent. Thus, when the battery pack 28 is inserted into the receptacle it will be locked into place with the contacts of the battery pack 28 abutting corresponding contacts formed in the top surface 20 of the housing 16.

Figure 3:
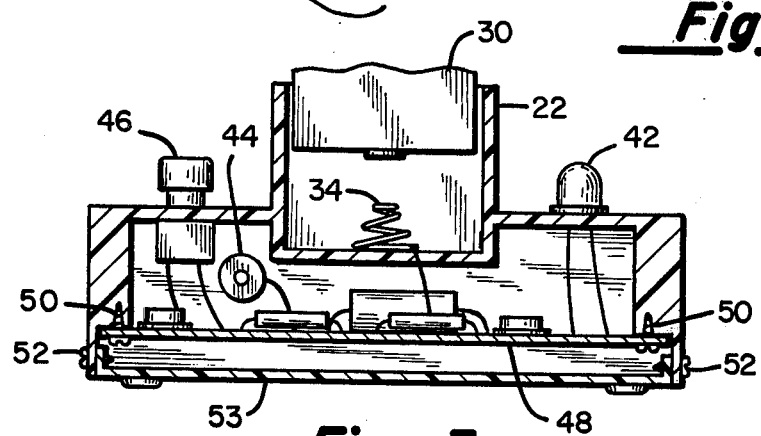
FIG. 3 is a cross-sectional view of the test stand showing the placement of the various indicators and related circuitry.

The location and shape of the contacts contained within the receptacle 22 are better illustrated in the top view of FIG. 3. Specifically, there is shown first and second coil spring type contacts 34 and 36 which project upwardly from the top surface 20 of the housing 16. These contacts are oriented such that they cooperate with corresponding contacts (not shown) in the bottom surface of the battery pack 28. Because the contacts 34 and 36 are coil springs, they press resiliently against the electrical contacts on the battery pack to ensure good electrical connection and also provide a force to pop the battery pack 28 out from the receptacle when the detent latch 32 is depressed.

Figure 2:
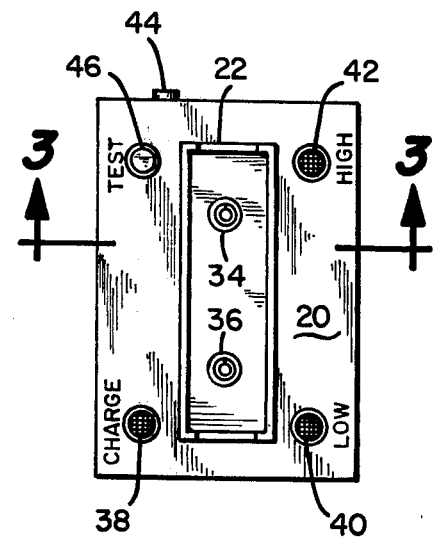
FIG. 2 is a top view of the stand of FIG. 1.

Also located on the top surface 20 of the receptacle of the charging stand 18 are three apertures 38, 40 and 42. These apertures provide a passage through which the lenses of suitable indicator lights may pass. These lights are preferably light emitting diodes (LED's) and associated respectively with the lights 38, 40 and 42 are legends reading "CHARGE", "LOW" and "HIGH". The female receptacle 44, which is adapted to receive the male jack pin 14, is also illustrated in the top view of FIG. 2, as is a manually operable push botton switch 46.

The cross-sectional view of FIG. 3 illustrates the internal arrangement of the electrical circuit components contained within the case or housing 16. Contained with the case 16 is a printed circuit card 48 having a desired pattern of printed wiring formed thereon. Mounted on the card 48 are the electrical components used in the preferred implementation. The printed circuit board 48 may be secured to the case or housing 16 by screws 50 or any other suitable connector. The bottom of the case or housing 16 has a bottom plate 52 which is also fastened to the side walls of the case by screw 52.

Now that the mechanical construction of the charging stand of the present invention has been described in detail, consideration will be given to the construction and mode of operation of the electrical circuits used therein.

Figure 4:
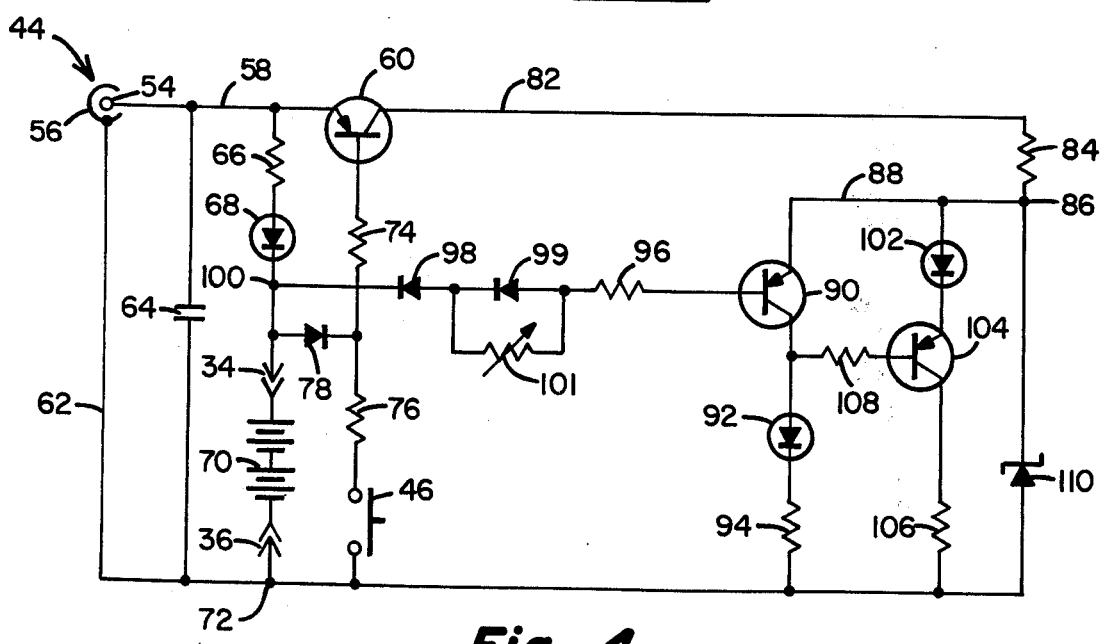
FIG. 4 is an electrical schematic diagram of the electronic circuitry contained within the charging stand of FIG. 1.

Referring to FIG. 4, there is shown by means of an electrical schematic diagram the circuitry incorporated within the housing 16, most of which is contained on the printed circuit board 48. Identified by numeral 44 is the female socket connector. A DC voltage is applied from the AC to DC converter 12 to the contact 54 contained within the socket 44. This potential is with respect to that maintained on the remaining contact 56 of the socket 44. Contact 54 is connected by means of a conductor 58 to the emitter electrode of a PNP transistor 60. Connected to the contact 56 of the socket 44 is a conductor 62 which forms a common return bus for the circuit. Connected between the conductor 58 and the conductor 62 is a capacitor 64 which acts as a filter to smooth out any ripple voltage that may appear at the output of the AC to DC converter 12.

A series combination of a resistor 66 and a light emitting diode 68 is connected between the conductor 58 and the contact 34 of the battery receptacle 22. The battery pack 30 is represented by the conventional battery symbol 70. The negative terminal of the battery pack 70 is arranged to make contact with the contact 36 of the charging stand and this contact is in turn connected to junction 72 to the return bus 62. The base electrode of the PNP transistor 60 is adapted to be coupled to the bus 62 through a series combinations of a resistor 74, resistor 76 and the manually operable pushbutton switch 46. A semiconductor diode 78 is connected between the contact 34 and a junction point 80 which is formed between the series resistors 74 and 76.

The collector electrode of transistor 60 is connected by means of a conductor 82 to one side of a resistor 84 whose remaining terminal is connected to a junction point 86. The junction point 86, in turn, is connected by means of a conductor 88 to the emitter electrode of a second PNP transistor 90. The collector electrode of the transistor 90 is coupled through a light emitting diode (LED) 92 and a resistor 94 to the return bus 62. The base electrode of transistor 90 is coupled through a series combination of a resistor 96 and first and second semiconductor diodes 98 and 99 to the junction point 100 formed between a terminal of the LED 68 and the contact 34. A variable resistor 101 is connected in parallel with the diode 99.

A third LED 102 has its cathode connected to the conductor 88 and its anode connected to the emitter electrode of a third PNP transistor 104. The collector electrode of transistor 104 is connected by means of a resistor 106 to the return bus 62 and the base electrode of transistor 104 is connected 30 through a resistor 108 to the collector electrode of the transistor 90.

While the circuit of FIG. 4 illustrates the use of PNP transistors throughout, it is obvious to those of ordinary skill of the art that NPN transistors may also be used, provided proper polarity conventions are observed throughout. Finally, a Zenar diode 110, poled as illustrated, is connected between the return bus 62 and the junction point 86. This completes a detailed description of the various connection of the circuit used in implementing the charging stand of the present invention. Consideration will now be given to the mode of operation of this circuit.

As was mentioned earlier in this specification, the device operates in two modes, the "charge mode" and the "test mode". These two modes of operation will be considered in order.

OPERATION—CHARGE MODE

When a DC potential is applied by way of the AC to DC converter 12 between the jack terminals 54 and 56 and a battery pack 70 is inserted into the receptacle 22 of the test stand such that its positive terminal abuts the contact 34 and its negative terminal abuts the contact 36 a charging current will flow through conductor 58, resistor 66, LED 68, battery 70 and return bus 62. The LED 68 will glow, indicating that the charging current is flowing. After a period of time ranging from a fraction of an hour to several hours, the flow of charging current to the battery pack will bring it to its fully recharged condition.

OPERATION—TEST MODE

As was mentioned earlier in the specification, the charging stand of the present invention may be used to provide an immediate indication of the condition of a battery pack, i.e. whether its charge state is "HIGH" or "LOW". To perform this test, the operator merely inserts the battery pack of unknown condition into the receptacle 22 of the stand 18 and momentarily depresses the manually operable push button switch 46. When the test switch is closed, an increased current flows from contact 54, through conductor 58, through resistor 66, LED 68, the diode 78 and resistor 76 to the return conductor 62. The increased drop across the resistor 66 causes the potential on the base of transistor 90 and on the base of transistor 60 to go negative, turning on both of these transistors, assuming that the battery 70 is in a totally or partially discharged condition. Under this assumed condition, then, the LED 92 will be illuminated indicating a "LOW" charge condition. If, on the other hand, the battery of unknown condition were in a substantially charged condition the battery potential would maintain the base of the transistor 90 relatively positive with respect to the emitter thereof which is held at a reference potential by the action of Zenar diode 110. With transistor 90 nonconducting, transistor 104 is turned on and a sufficient current flows through the LED 102 to give a visual indication of the "HIGH" condition of the battery pack 70. The variable resistor 101 may be adjusted to determine the point at which the "high" indicator 102 comes on to thereby calibrate the unit and compensate for variations in the Zenar diodes 110 used.

Typical values for the components used in the preferred embodiment are set forth below. However, it is to be understood that these values are only set forth for exemplary purposes and limitation to these precise values is not intended and should not be inferred.

TABLE

| | |
|---|---|
| $C_{64}$ | 220 uf |
| $R_{66}$ | 330 ohms |
| $R_{74}$ | 10k ohms |
| $R_{76}$ | 47 ohms |
| $R_{84}$ | 47 ohms |
| $R_{96}$ | 1k ohms |
| $R_{94}$ | 220 ohms |
| $R_{108}$ | 6.2k ohms |
| $R_{102}$ | 220 ohms |
| $R_{101}$ | 0-20k ohms |
| Transistors $_{60,90,104}$ | 2N4403 |
| LED's $_{68,92,102}$ | FLV 110 |
| Diode $_{78}$ | 1N4001 |
| Diode $_{98,99}$ | 1N914 |
| Zenar diode $_{110}$ | 1N5234 |

Having described the preferred embodiment of a new and improved low cost, fool-proof, rechargeable battery charging stand constructed in accordance with the invention, it is believed obvious that other modifications and variations of the invention are possible in light of the above teachinges. It is therefore to be understood that changes may be made in the particular embodiment of the invention described which are within the full intended scope of the invention as defined by the appended claims.

We claim:
1. A charging test stand for use in recharging and testing rechargeable battery packs comprising:
   (a) a receptacle having a pair of contacts therein adapted to mate with a battery pack to be charged or tested;
   (b) a jack adapted to be connected to a source of direct current potential;
   (c) first indicator means coupled in a series path between said jack and said pair of contacts, for providing a visual indication that charging current is flowing through said series path;
   (d) a first semiconductor current control means having emitter, collector, and base electrodes, said base electrode being coupled to a first of said pair of contacts and said emitter electrode being coupled to said jack;
   (e) a second semiconductor current control means having emitter, collector and base electrodes, said base electrode of said second semiconductor current control means also being coupled to said first of said pair of contacts, the emitter electrode of said second semiconductor current control means being coupled to said collector electrode of said first semiconductor current control means;
   (f) second indicator means coupled between said collector electrode of said second semiconductor current control means for indicating a first state of charge of said battery packs;
   (g) a third semiconductor current control means having emitter, collector and base electrodes, said base electrode of said third semiconductor current control means being coupled to said collector electrode of said second semiconductor current control means and said collector electrode of said third semiconductor current control means being coupled to said jack; and
   (h) a third indicator means connected between the emitter electrodes of said second and third semiconductor current control means for indicating a second state of charge of said battery pack.

2. Apparatus as in claim 1 and further including a normally open test switch having one of its contacts connected to said jack and the other of its contacts coupled to said base electrode of said first semiconductor current control means.

3. Apparatus as in claim 1 wherein said first, second and third semiconductor current control means are PNP type transistors.

4. Apparatus as in claim 1 wherein said first, second and third indicator means are light emitting diodes.

5. Apparatus as in claim 4 wherein said light emitting diodes are mounted on said receptacle so as to be visually observable.

* * * * *